United States Patent
Dyer et al.

(10) Patent No.: US 7,085,337 B2
(45) Date of Patent: Aug. 1, 2006

(54) ADAPTIVE PER-PAIR SKEW COMPENSATION METHOD FOR EXTENDED REACH DIFFERENTIAL TRANSMISSION

(75) Inventors: Kenneth C. Dyer, Davis, CA (US); Hiroshi Takatori, Sacramento, CA (US)

(73) Assignee: KeyEye Communications, Sacramento, CA (US)

( * ) Notice: Subject to any disclaimer, the term of this patent is extended or adjusted under 35 U.S.C. 154(b) by 0 days.

(21) Appl. No.: 10/938,139

(22) Filed: Sep. 10, 2004

(65) Prior Publication Data

US 2005/0099216 A1    May 12, 2005

Related U.S. Application Data

(60) Provisional application No. 60/507,606, filed on Sep. 30, 2003.

(51) Int. Cl.
*H04L 7/00* (2006.01)
(52) U.S. Cl. ....................... 375/354; 375/330
(58) Field of Classification Search ................ 375/354
See application file for complete search history.

(56) References Cited

U.S. PATENT DOCUMENTS

| | | | | |
|---|---|---|---|---|
| 3,869,670 A | * | 3/1975 | Grutzmann et al. | 375/286 |
| 6,127,871 A | * | 10/2000 | Moll | 327/270 |
| 6,167,077 A | | 12/2000 | Ducaroir et al. | 375/219 |
| 6,788,754 B1 | | 9/2004 | Liepe | 375/375 |
| 6,900,685 B1 | * | 5/2005 | Silvestri | 327/276 |
| 2002/0191719 A1 | * | 12/2002 | Hasako et al. | 375/346 |
| 2004/0064765 A1 | | 4/2004 | Panis, Michael C. | 714/700 |

FOREIGN PATENT DOCUMENTS

WO    WO 02/101931    * 12/2002

\* cited by examiner

*Primary Examiner*—Jay K. Patel
*Assistant Examiner*—Curtis Odom
(74) *Attorney, Agent, or Firm*—Lumen Intellectual Property Services, Inc.

(57) ABSTRACT

High speed data transmission schemes often use differential lines to reduce the effect of noise on the data signal. Unfortunately, the signal propagation on the positive and negative lines may be different, which leads to a signal skew problem. This document describes a novel way of compensating for differential line skew in data transmission lines.

19 Claims, 6 Drawing Sheets

ADAPTIVE PER-PAIR SKEW COMPENSATION METHOD FOR EXTENDED REACH DIFFERENTIAL TRANSMISSION

RELATED APPLICATIONS

This application claims priority under 35 U.S.C. §119(e) to provisional application No. 60/507,606 filed on Sep. 30, 2003 titled "Adaptive Per-Pair Skew Compensation Method for Extended Reach Differential Transmission."

FIELD

The invention relates to data transmission, and, more specifically, to skew between differential transmission lines, which may be shielded or unshielded.

BACKGROUND

Differential transmission lines are used in high-speed data communication in order to reduce the effect of electrical interference on the signal. A differential transmission line usually consists of a pair of wires, one positive and one negative. Ideally the signal propagation in the positive and negative wires is the same with respect to the shield or ground. This results in a signal pulse that has a minimum dispersion (growth in width).

FIG. 1 shows graphs of voltage vs. time for the positive and negative signals 102, 104. The positive signal 102 has a signal peak at time $t=t_p$. The negative signal 104 has a signal peak at time $t=t_n$. In this case, $t_p=t_n$. A differential signal 108 that results from the two signals running through a subtracter 106 has a small dispersion and large voltage peak.

FIG. 2 is similar to that shown in FIG. 1, except that the positive and negative signals 202, 204 have a skew with respect to each other. In this case, $t_p$ does not equal $t_n$. The differential signal 208, as seen as the output of the subtracter 206, has a larger dispersion and lower peak voltage compared to that shown in FIG. 1. One skilled in the art will quickly recognize that the differential signal 108 in FIG. 1 is much more desirable than the differential signal 208 in FIG. 2 for reliable high-speed data communication. With long cable lengths (20 meters for example) and high data transmission rates (1.5 GHz for example), skew becomes a major issue.

Thus, there is a need for differential pair signal de-skewing in data communication systems.

SUMMARY

This document describes a method and apparatus to remove skew from a signal with one or more delay blocks.

DESCRIPTION

Cables that are used for differential data communication, both shielded and unshielded, may have differences in the positive and negative wires that cause skew between the positive and negative signals. As discussed above, this type of skew is undesirable for reliable high speed communication. By introducing actively controlled delay elements to the differential receiver, the skew can be reduced or eliminated before a signal is converted to data, thereby maximizing the signal integrity of the system. This novel approach treats the positive and negative signals as two different entities, instead of a single lumped differential signal.

Shielded cable usually provide a grounding sheath that provides a voltage reference for the positive and negative signals. Unshielded cables do not provide the sheath and rely on the earth ground for the voltage reference. For the purposes of this application, it may be advantageous to consider skew as relative to a triggering clock edge at the signal source transceiver.

Figure 1:
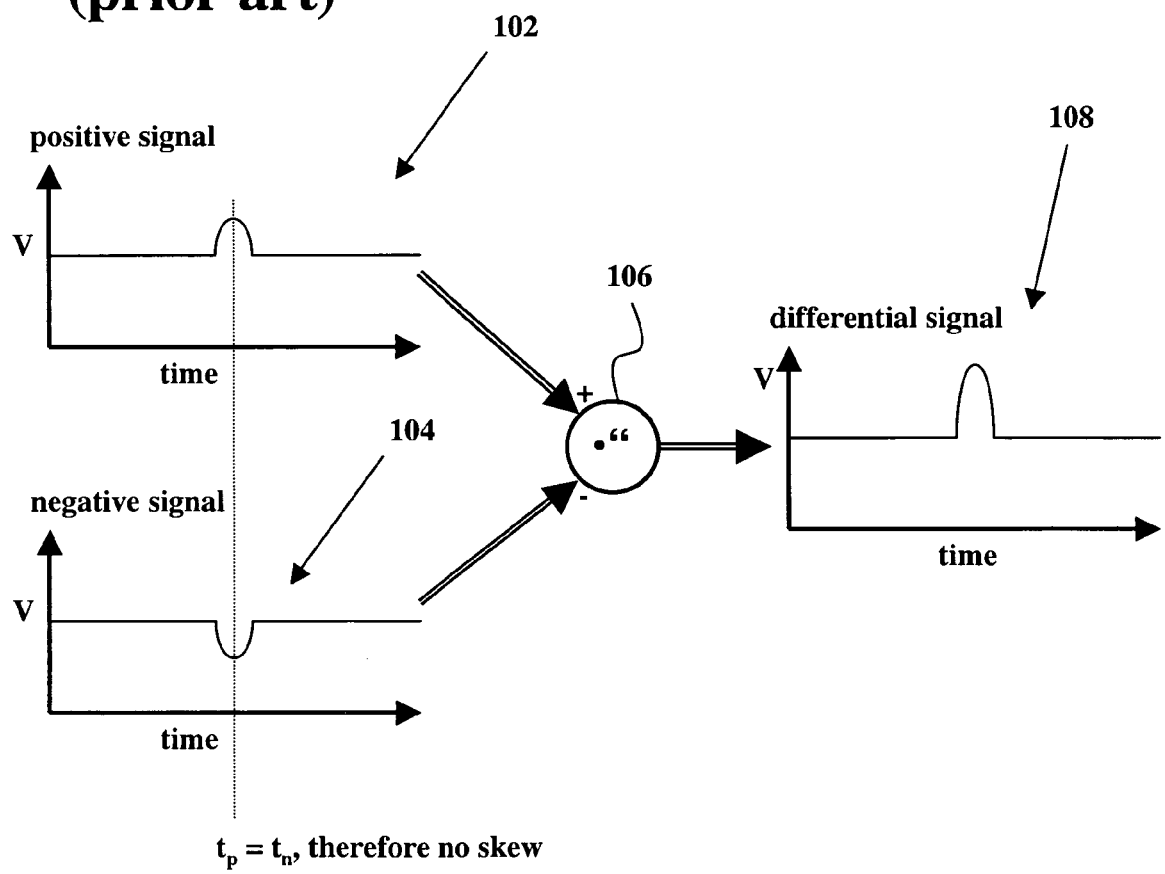
FIG. 1 shows graphs of voltage vs. time for positive and negative transmission signals.
Figure 2:
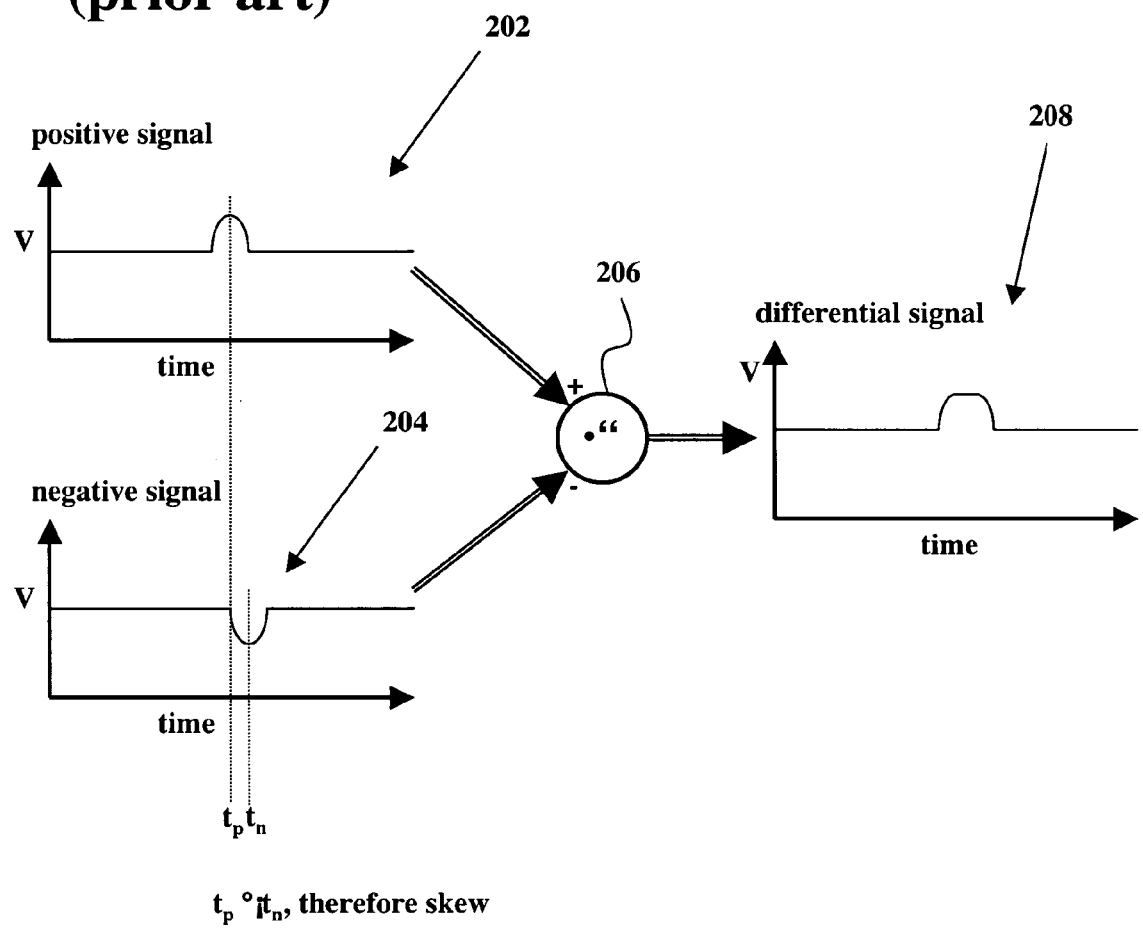
FIG. 2 shows graphs of voltage vs. time for skewed positive and negative transmission signals.
Figure 3:
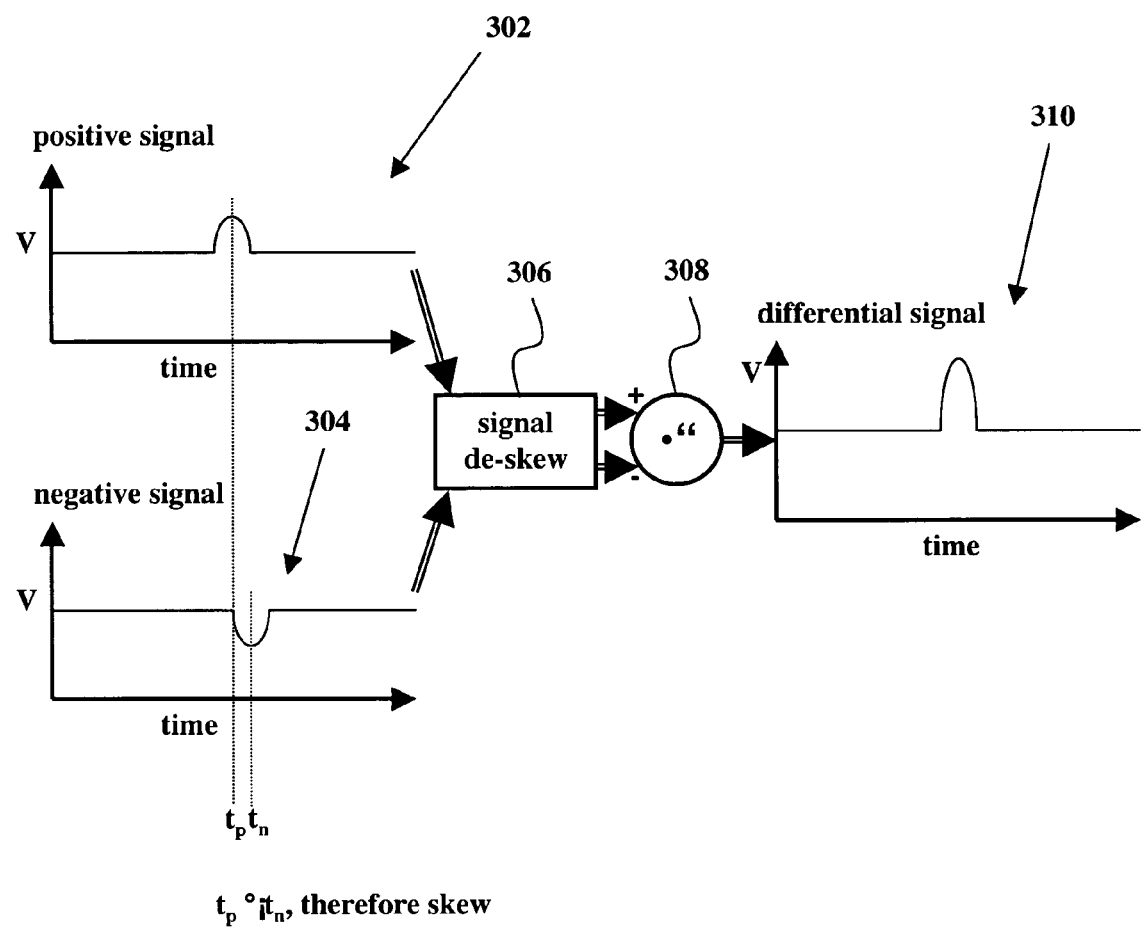
FIG. 3 shows an example of a de-skew arrangement.

FIG. 3 shows an example of a de-skew arrangement. Positive and negative signals 302, 304 are fed into a de-skew module 306. In this case, the skew is $t_n-t_p$. The module senses the skew in the signal pair and delays the propagation of one or both of the signals 302, 304 in order to remove the skew from the signal pair. The de-skewed signals are then fed into the subtracter 308. The resulting differential signal 308 has a small dispersion and large voltage peak.

Figure 4:
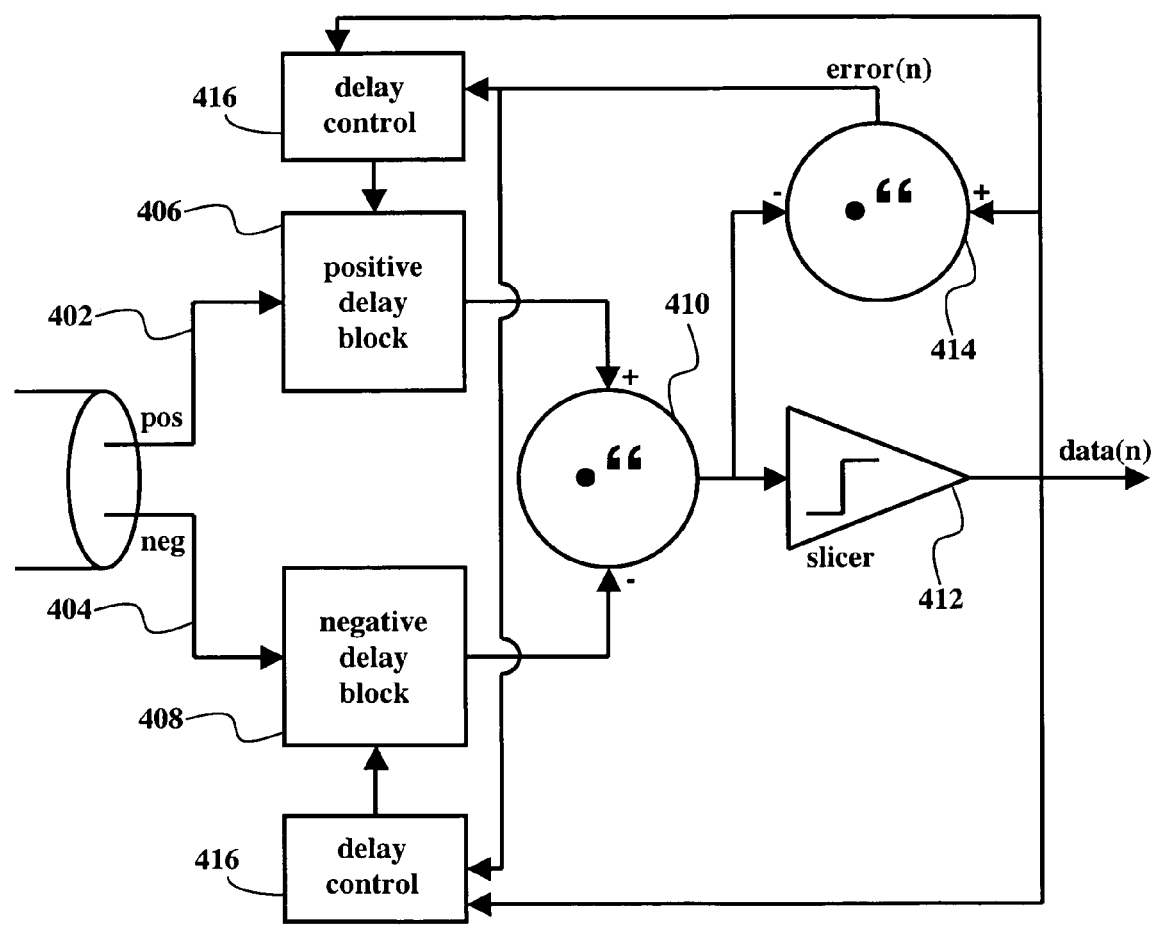
FIG. 4 shows a layout of a de-skewing receiver.

FIG. 4 shows a layout of a de-skewing receiver. Positive and negative transmission lines 402, 404 carry the respective positive and negative signals. The positive signal enters the positive delay block 406. The negative signal enters the negative delay block 408. The delay blocks 406, 408 delay their corresponding signals such that the signal skew in minimized. The signals leave the delay blocks 406, 408 and enter the subtracter 410. The output of the subtracter 410 is the analog differential signal. The analog differential signal is fed into both the slicer 412 and the error subtracter 414. The slicer 412 converts the analog differential signal into the digital data stream noted as data(n). The analog differential signal is subtracted from an analog signal that represents the digital data stream at the error subtracter 414. The digital output of the error subtracter 414 is noted as error(n). Error(n) represents the difference between the measured analog differential signal and the desired signal. Both the error(n) and data(n) streams are fed into the delay control blocks 416. The delay control blocks 416 control the delay behavior of the positive and negative delay blocks 406, 408. The delay control blocks 416 comprise two different block as shown, but, in reality, may comprise a single control block 416 that controls both delay blocks 406, 408. The delay control blocks 416 may also be referred to as an adaptive algorithm block.

The slicer 412 as shown has two output levels. For systems that use pulse amplitude modulation (PAM) to carry more bits of data per pulse, an analog to digital (A/D) converter may be used in place of the slicer 412. An A/D converter may be constructed using a slicer for each level of PAM in the differential signal. The slicer 412 may need a D/A converter to send an analog representation of the data stream to the error subtracter 414.

For a simple example of the slicer 412 operation, consider the following. If a system has two level PAM at 0 and 1 V and the output of the subtracter 410 is 1 V, then the error is 0 V. If, on the other hand, the output of the subtracter 410 is 0.9 V, then the error is 0.1 V. In the second case, the delay control block 416 would alter the delay coefficients of the delay blocks 406, 408 in such a way as to minimize the delay. The delay control block 416 may use an integrator to determine appropriate coefficients for the delay blocks 406, 408. Iterative algorithms for determining appropriate coefficients are well known (*Adaptive Signal Processing* by Bernard Widrow and Samuel Stearns, Prentice-Hall, New Jersey, 1985 pages 99–114).

Figure 5:
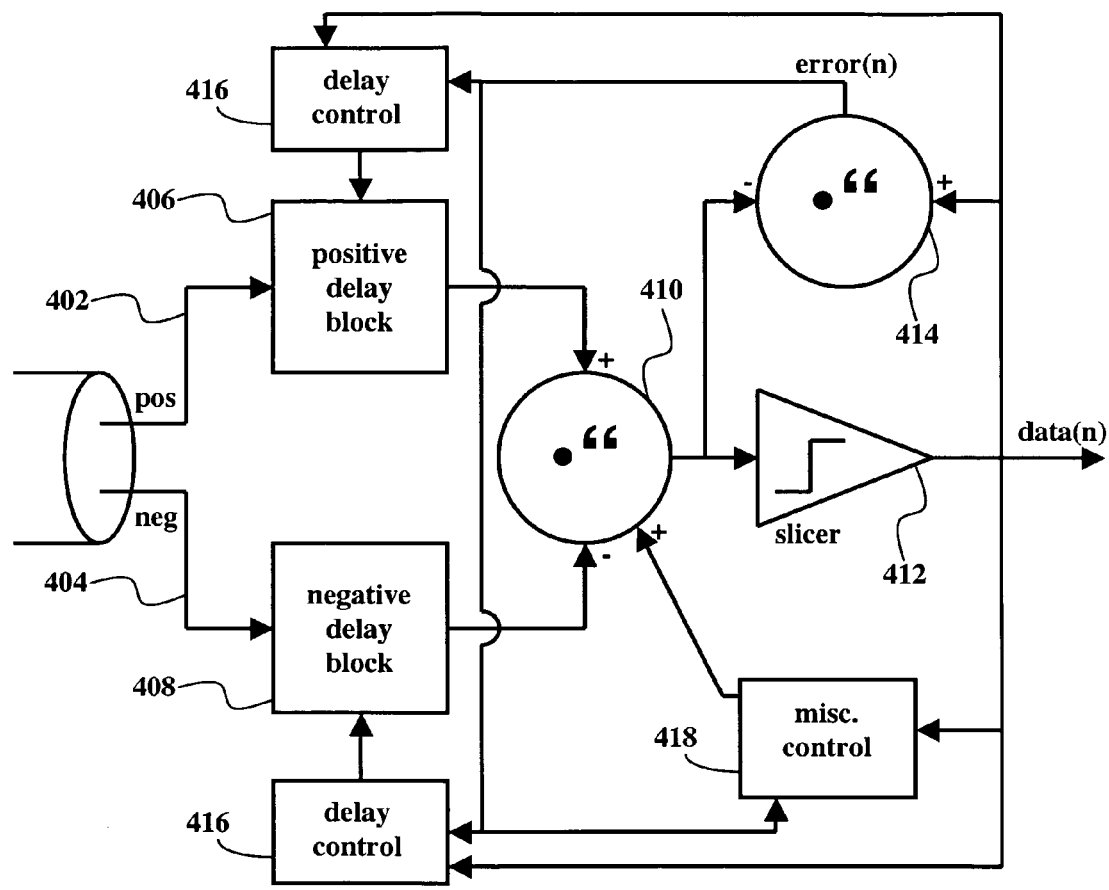
FIG. 5 shows a layout of a de-skewing receiver with additional control elements.

FIG. 5 shows a layout of a de-skewing receiver with additional control elements. The layout shown is similar to that shown in FIG. 4 with the addition of a miscellaneous control block 418. The control block 418 receives the error(n) and data(n) streams and outputs a signal to the subtracter 410. The control block 418 may include any additional elements deemed necessary by the designer, such as an equalizer or echo canceller.

Figure 6:
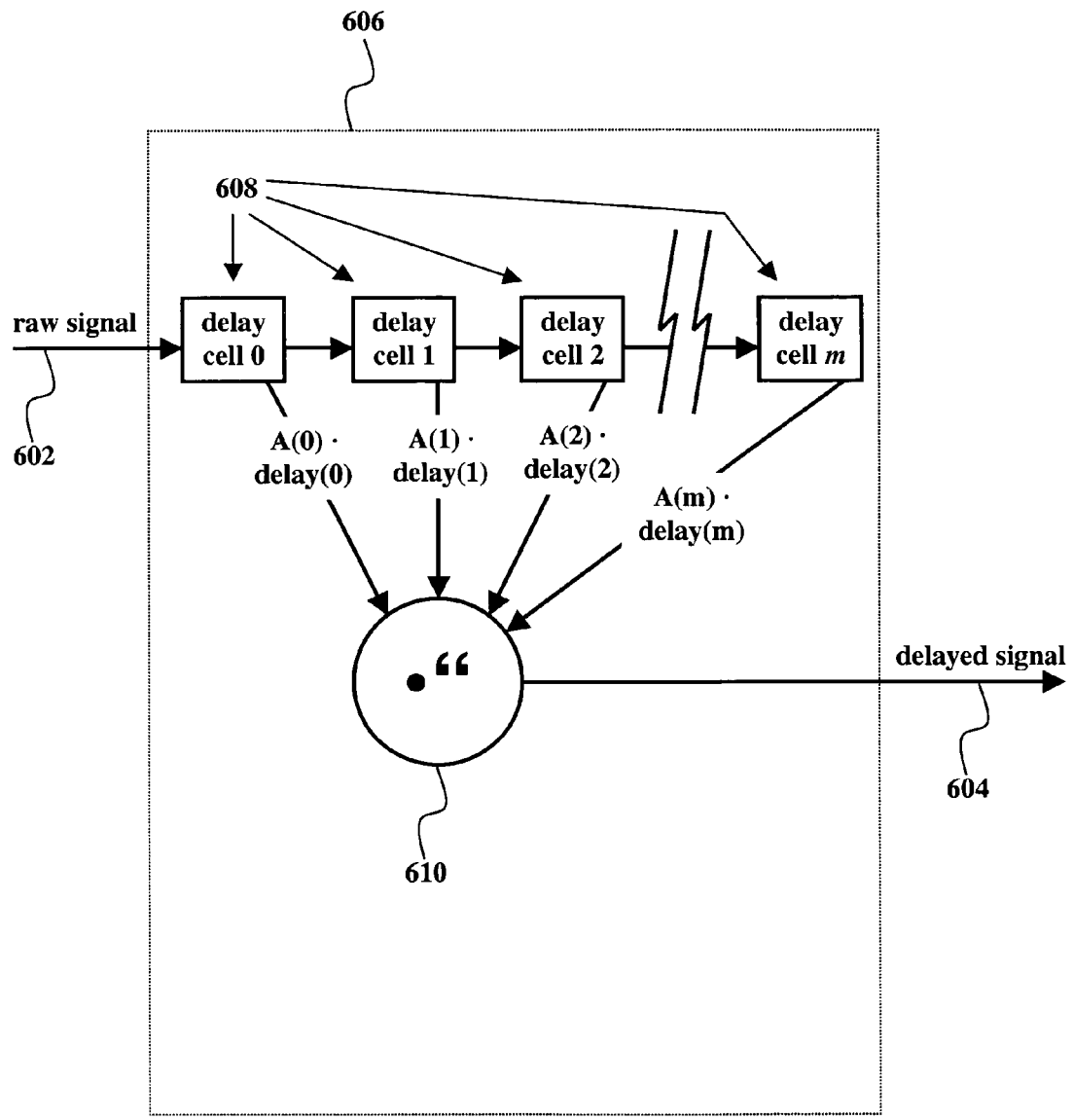
FIG. 6 shows an example of the internal components of a delay block.

FIG. 6 shows an example of the internal components of a delay block. The delay block 606 may be either the positive or negative delay blocks 406, 408 shown in FIGS. 5, 6. The delay block includes one or more delay cells 608 that each have a controllable propagation delay. The propagation delay is controlled by the delay control block 416. The delay of each individual delay cell should be less than one baud. Of course, the overall delay of the delay block 606 may be more than one baud.

A raw signal 602 enters the delay block 606 and goes into the first delay cell 608. The first delay cell delays the signal propagation by a certain amount, which may also be zero. The signal may propagate through each successive delay cell 608 before heading to the summer 610. The summer 610 adds the partial signals from all of the delay cells 608 to create the delayed signal 604. Each delay cell has an associated coefficient. For example, the first delay cell 608, delay cell zero, has a coefficient of A(0). The next delay cell has a coefficient of A(1), etc. The coefficients range between 0 and 1. The coefficients may be digital or analog. If they are digital, their values are converted to analog before being multiplied by the cell delay value.

Each delay cell 608 has an associated cell delay value between 0 and _baud. Cell delay values may be different for each cell. For example, consider the case where each delay cell 608 has an ever decreasing cell delay value: delay(0)=_baud, delay(1)=_baud, delay (2)=⅛ baud, etc. The cell delay value is multiplied by the corresponding coefficient. The result is summed at the summer 610 with all of the other multiplied results. The output of the summer is the delayed signal 604. Ideally, the sum of all of the coefficients equals 1.

The true delay should be determined by simulation. High precision systems would need finer delay control, therefore less than _baud delay. The true range/resolution of the delay block 606 may depend on: (1) system required precision (this would be determined by simulations optimizing BER vs. delay_cell delay, which may be part of the process of implementation), and (2) length of cable (longer cables generally give more skew and would require more delay cells). The fact that both the positive and negative signals are delayed is advantageous since only half of the total delay is needed on either side (worst case is minimum delay on+ and max on−, or vise versa).

The delay control block 416 stores and uses delay coefficients to control the propagation delay of each delay cell 608. Thus, for m+1 delay blocks, coefficients A(0), A(1), A(2), . . . , A(m) are used. The corresponding z-transform is $f(A(0)+A(1)z^{-1}+A(2)z^{-2}+ \ldots +A(m)z^{-m}$ the differential output of the subtracter 410 would be $f_{positive} - f_{negative}$.

The delay coefficients are updated by the delay control block 416 relative to the system clock. The coefficients may be updated every clock cycle or every n clock cycles, where n is an integer. The number of delay cells necessary for a given system depends on the range and resolution of the desired added delay. The delay introduced by all of the delay cells 408 in a delay block 606 should be greater than the worst cast delay that may be required. Use of a system simulator will aid the designer in determining the appropriate number of delay cells 408.

The amount of delay that each delay cell 408 may relative to a fixed value or not, depending on the desired outcome. For example, a delay tied to the system clock, a flip flop, or a given delay may be considered to be based on a fixed delay. A delay tied to an analog delay that varies with respect to current, for example, may be considered to be based on a variable delay.

What is claimed is:

1. A differential transmission de-skew system comprising:
   a first delay block;
   a second delay block;
   an output port;
   a first subtracter, the first subtracter subtracting an output of the second delay block from an output of the first delay block, where an output of the first subtracter comprises an analog differential signal;
   at least one slicer, the at least one slicer converting the analog differential signal to a digital signal, the digital signal exiting through the output port; and
   a second subtracter, the second subtracter subtracting the analog differential signal from the digital signal,
   wherein the first delay block comprises a plurality of delay cells.

2. The system of claim 1, wherein delays introduced by the first and second delay blocks are fixed to a system clock.

3. The system of claim 1, wherein delays introduced by the first and second delay blocks are variable relative to a system clock.

4. The system of claim 1, wherein a delay introduced by a given delay cell is less than a baud time.

5. The system of claim 1, wherein the system receives signals from positive and negative leads of a differential transmission cable.

6. The system of claim 5, wherein the system removes skew between the positive and negative signals.

7. The system of claim 6, wherein the system adaptively adjusts to remove skew.

8. The system of claim 1, further comprising a closed feedback control loop, the control loop adjusting at least one delay block in order to minimize skew of signals propagating through the system.

9. The system of claim 1, wherein the second delay block comprises at least one delay cell.

10. The system of claim 1, wherein the analog signal comprises a pulse amplitude modulated signal with at least two levels.

11. The system of claim 1, further comprising an adaptive algorithm block, the adaptive algorithm adjusting delay coefficients of the first and second delay blocks.

12. The system of claim 11, wherein inputs to the adaptive algorithm include incoming line data, output data, and data error.

13. The system of claim 1, wherein delay block coefficients are updated every clock cycle.

14. The system of claim 1, wherein delay block coefficients are updated every at least two clock cycles.

15. A method of de-skewing a differential signal comprising:
- propagating a positive signal through a first delay block;
- propagating a negative signal through a second delay block;
- actively controlling at least one delay block to affect signal propagation, the affected propagation minimizing skew between the positive and negative signals;
- subtracting signals exiting the first and second delay blocks with a first subtracter;
- slicing an analog signal exiting the first subtracter into a digital output signal; and
- subtracting the analog signal exiting the first subtracter from the digital output signal with a second subtracter to create an error signal,
- where the first and second delay blocks each comprise a plurality of delay cells.

16. The method of claim 15, further comprising: using the delayed positive and negative signals, a digital output signal, and an error signal to affect delay block coefficients in at least one delay block.

17. A differential data transmission de-skew system comprising:
- a first delay block;
- a second delay block;
- an output port;
- a first subtracter, the first subtracter subtracting an output of the second delay block from an output of the first delay block, where an output of the first subtracter comprises an analog differential signal;
- at least one slicer, the at least one slicer converting the analog differential signal to a digital signal, the digital signal exiting through the output port;
- a second subtracter, the second subtracter subtracting the analog differential signal from the digital signal; and
- a delay control block, the delay control block adjusting delay coefficients of the first and second delay blocks, the delay control block completing a closed feedback control loop, the control loop minimizing skew of signals propagating through the system;
- where a delay introduced by a given delay cell is less than a baud time,
- where the system receives signals from positive and negative leads of a differential transmission cable,
- where the first and second delay blocks each comprise at least one delay cell,
- where the analog differential signal comprises a pulse amplitude modulated signal with at least two levels,
- where inputs to the delay control block include output data, and error data, and
- where delay block coefficients are updated every at least one clock cycles.

18. The system of claim 17, wherein delays introduced by the first and second delay blocks are fixed to a system clock.

19. The system of claim 17, wherein delays introduced by the first and second delay blocks are variable relative to a system clock.

* * * * *